US007843032B1

(12) United States Patent
Khieu et al.

(10) Patent No.: US 7,843,032 B1
(45) Date of Patent: Nov. 30, 2010

(54) RADIO FREQUENCY IDENTIFICATION DEVICE ELECTROSTATIC DISCHARGE MANAGEMENT

(75) Inventors: Cong Khieu, San Jose, CA (US); Yanjun Ma, Bellvue, WA (US); Jaideep Mavoori, Bellevue, WA (US)

(73) Assignee: Synopsis, Inc., Mountain View, CA (US)

( * ) Notice: Subject to any disclaimer, the term of this patent is extended or adjusted under 35 U.S.C. 154(b) by 306 days.

(21) Appl. No.: 11/965,307

(22) Filed: Dec. 27, 2007

Related U.S. Application Data (62) Division of application No. 11/837,810, filed on Aug. 13, 2007.

(60) Provisional application No. 60/919,990, filed on Mar. 26, 2007.

(51) Int. Cl.
*H01L 21/82* (2006.01)

(52) U.S. Cl. .................. 257/499; 257/367; 257/122; 257/E29.04

(58) Field of Classification Search ................ 257/369, 257/111, 112, 122, 124, 141, 173, 355, 367, 257/E29.04, E29.003, E29.255, E29.325; 340/572.7
See application file for complete search history.

(56) References Cited

U.S. PATENT DOCUMENTS

| 6,288,884 | B1 * | 9/2001 | Yu ............................. 361/111 |
| 6,777,721 | B1 * | 8/2004 | Huang et al. ................. 257/111 |
| 7,141,831 | B1 * | 11/2006 | Vashchenko et al. ........ 257/124 |
| 7,718,480 | B1 * | 5/2010 | Vashchenko et al. ........ 438/193 |

* cited by examiner

*Primary Examiner*—Roy K Potter
(74) *Attorney, Agent, or Firm*—Nixon Peabody LLP; David B. Ritchie

(57) ABSTRACT

Apparatus, systems, and methods may include managing electrostatic discharge events in radio frequency identification (RFID) devices by using a semiconductor circuit having a non-aligned gate to implement a snap-back voltage protection mechanism. Such circuits may be formed by doping a semiconductor substrate to form a first conductive region as a well, forming one of a source region and a drain region in the well, depositing a layer of polysilicon on the substrate to establish a gating area that does not overlap the one of the source region and the drain region, and forming an integrated circuit including an RFID circuit that is supported by the substrate to couple to the one of the source region and the drain region to provide snap-back voltage operation at a node between the integrated circuit and the source or drain region. Additional apparatus, systems, and methods are disclosed.

10 Claims, 6 Drawing Sheets

INTEGRATED CIRCUIT
STRUCTURE

INTEGRATED CIRCUIT WITH EMBEDDED N-WELL STRUCTURE

RADIO FREQUENCY IDENTIFICATION DEVICE ELECTROSTATIC DISCHARGE MANAGEMENT

PRIORITY CLAIMS

This is a Divisional of U.S. patent application Ser. No. 11/837,810, filed on Aug. 13, 2007, and titled "Electrostatic Discharge Management Apparatus, Systems, and Methods" which claims the benefit of the filing date of U.S. Provisional Patent Application Ser. No. 60/919,990, filed on Mar. 26, 2007, and titled "Snap-Back Mechanism High Voltage ESD Design". Both applications are commonly assigned to the assignee of the instant application, Impinj, Inc., and incorporated herein by reference in their entirety.

BACKGROUND INFORMATION

Electrostatic discharge (ESD) protection circuitry is typically employed as an adjunct to other circuits, such as memories and processors, that include components that are sensitive to high voltage ESD events. In principle, ESD protection circuitry operates to provide some protection against high voltage by providing an alternative flow path for currents resulting from ESD events, so that the protected circuitry may continue to operate.

Some ESD protection circuits employ a diode as the primary protective component. However, this approach may present a relatively high impedance path for currents generated by ESD events, especially with respect to high voltage circuit inputs, such as memory programming pin inputs. When this happens, ESD currents may be directed into a node of the circuit that is to be protected, rather than into the preferred alternative path. Destruction of the circuit to be protected may result.

DETAILED DESCRIPTION

High voltage metal-oxide semiconductor field-effect transistor (MOSFET) devices may be subject to parasitic bulk substrate currents during operation that result in a phenomenon called snap-back, causing junction breakdown at a voltage level substantially below the rated device breakdown. This snap-back phenomenon is believed to be the result of substrate currents causing the source to become forward-biased. The challenges noted above may be addressed by taking advantage of this phenomenon to fabricate ESD protection circuitry that includes a snap-back protection mechanism. For example, ESD protection circuitry may be formed as part of an integrated circuit chip that includes a semiconductor substrate supporting a gate layer that does not overlap one of either a source region or a drain region of a semiconductor device (e.g., a non-self aligned MOS device) coupled to the electrical circuit to be protected, so that snap-back voltage operation is provided by the semiconductor device when destructive ESD events occur. Related circuits, processes, methods, semiconductor devices, and articles used to form such devices, are also described.

Figure 1:
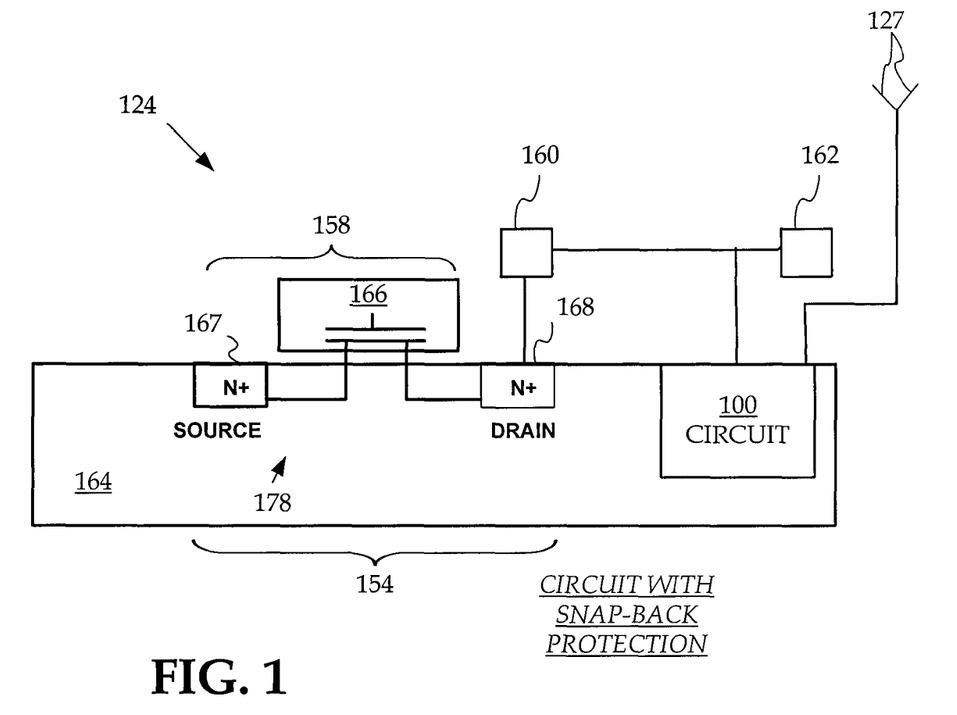
FIG. 1 is a block diagram of an integrated circuit chip including an electrical circuit and snap-back protection circuitry, according to various embodiments of the invention.

FIG. 1 is a block diagram of an integrated circuit chip 124 including an electrical circuit 100 and snap-back protection circuitry 154, according to various embodiments of the invention. Here it can be seen that the snap-back protection circuitry 154 includes a semiconductor device 178, comprising a metal-oxide semiconductor (MOS) device. Thus, the integrated circuit chip 124 may comprise a semiconductor substrate 174 (e.g., a p-type substrate), an electrical circuit 100 formed on the semiconductor substrate 174, and a gate layer 166 supported by the substrate 174. The gate layer 166, perhaps comprising polysilicon, is deposited on the substrate so that it does not overlap at least one of either the source region 167 or the drain region 168 included in the semiconductor device 178 coupled to the electrical circuit 100, perhaps via the pad 160. In this manner, the source region 167 or the drain region 168 that is not overlapped by the gate layer 166 can provide snap-back voltage operation with respect to the circuit 100. In some embodiments, as will be discussed later, the semiconductor device 178 may comprise a p-FET or an n-FET MOS device.

In some embodiments, the gate layer 166 may be weakly coupled to the source supply voltage $V_{SS}$, using a soft $V_{SS}$ mechanism 158. In other words, the gate layer 166 may not be connected to the source supply voltage $V_{SS}$ directly. This can be accomplished using several techniques. One is to use a one or two kilo-ohm resistor (not shown here, but see resistor 358 of FIG. 3) between the gate layer 166 and the source supply voltage $V_{SS}$. The other is to use a weak inverter having its input tied to the drain supply voltage $V_{DD}$, and its output coupled to the gate layer 166 (which is tied to the voltage $V_{SS}$). In some embodiments, the soft $V_{SS}$ mechanism 158 may be replaced by a soft $V_{DD}$ mechanism, wherein the voltage $V_{DD}$ is substituted for $V_{SS}$ in the previous discussion, and vice versa.

The circuit 100 may comprise any number of circuits, such as a processor, a data acquisition system, a memory, including a non-volatile memory, and/or a radio frequency circuit, in which case an antenna comprising one or more segments 127 may be coupled to the circuit 100. The node 162 may comprise a pin, a bump, a wire, or some other internal or external connection point which can be used to access signals present within the circuit 100.

In some embodiments, the circuit 100 comprises a one-time programmable (OTP) memory, or a multiple-times programmable (MTP) memory. Such memories may include on-chip charge pumps coupled to a relatively high voltage source (e.g., +10 VDC or greater), perhaps through the node 162. In some embodiments, the circuit 100 comprises a Radio Frequency IDentification (RFID) circuit, the components of which will be described in more detail with respect to FIG. 2.

Figure 2:
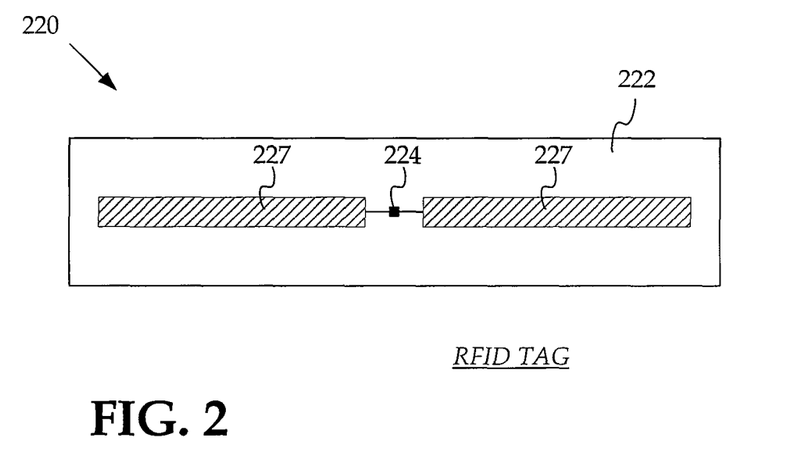
FIG. 2 is a diagram showing components of an RFID tag, including a tag that can be used in conjunction with the integrated circuit chip of FIG. 1, according to various embodiments of the invention.

FIG. 2 is a diagram showing components of an RFID tag 220, including a tag that can be used in conjunction with the integrated circuit chip of FIG. 1, according to various embodiments of the invention. While tag 220, as shown, is implemented as a passive tag, meaning it does not have its own power source, much of what is described in this document applies also to active tags.

Tag 220 is formed on a substantially planar inlay 222, which can be made in many ways known in the art. Tag 220 includes an electrical circuit 224, which is preferably implemented in an integrated circuit (IC) 224, and may be similar to or identical to the integrated circuit chip 124 of FIG. 1. IC 224 is arranged on and supported by the inlay 222, and typically includes RFID circuitry.

Tag 220 also includes an antenna for exchanging wireless signals with its environment. The antenna is usually flat and attached to inlay 222. IC 224 is electrically coupled to the antenna via suitable antenna ports (not shown).

The antenna may be made in a number of ways, as is well known in the art. In the example of FIG. 2, the antenna is made from two distinct antenna segments 227, which are shown here forming a dipole. Many other embodiments are possible, using any number of antenna segments. For example, in some embodiments, an antenna can be made with even a single segment 227. Different locations on the segment can be coupled to one or more of the antenna ports of IC 224. For example, the antenna can form a single loop, with its ends coupled to the ports. When the single segment has more complex shapes, it should be remembered that, at the frequencies of RFID wireless communication, even a single segment can behave as if it is constructed from multiple segments. In the embodiment of FIG. 2, the antenna segments 227 are separate from IC 224. In other embodiments, the antenna segments 227 may be formed on IC 224.

In operation, a signal is received by the antenna, and communicated to IC 224, where the included RFID circuitry both harvests power, and responds if appropriate, based on the incoming signal and its internal state. In order to respond by replying, IC 224 modulates the reflectance of the antenna, which generates the backscatter from a wave transmitted by an RFID reader. Coupling together and uncoupling the antenna ports of IC 224 can modulate the reflectance, as can a variety of other means.

As is well known in the art, integrated circuits such as IC 224 that include RFID circuitry may be divided functionally and/or physically into several parts or sections. These sections may include one or more antenna sections (described above), signal routing or switching sections, power management sections, radio sections, logical sections, processing circuitry sections, and memory sections.

Power management units (PMUs) or power management sections may be implemented in any way known in the art, and can be used for harvesting raw RF power received via the antenna, whether or not the received waveform is modulated. In earlier RFID tags, the power management section included an energy storage device, such as a battery. RFID tags with an energy storage device are known as active tags. Advances in semiconductor technology have miniaturized the electronics so much that an RFID tag can be powered solely by the RF signal it receives. Such RFID tags do not include an energy storage device, and are called passive tags.

Many RFID devices include a demodulator to demodulate an RF signal received via the antenna. The demodulator may be implemented in any way known in the art, including an attenuator stage, amplifier stage, and so on.

RFID devices may also include a processing block or processing circuitry to receive the demodulated signal from the demodulator, and to perform a variety of operations, including logical operations, as well as operating to generate an output signal for transmission. The processing block may be implemented in any way known in the art. For example, the processing block may include a number of components, such as a processor, a memory, a decoder, an encoder, and so on.

Finally, RFID devices may include a modulator to modulate an output signal generated by the processing block. The modulated signal is transmitted by driving antenna connections, and therefore by driving the load presented by the coupled antenna segment(s). The modulator may be implemented in any way known in the art, including a driver stage, an amplifier stage, and so on. In some embodiments, the demodulator and modulator are combined in a single transceiver circuit. The modulator may include a backscatter transmitter or an active transmitter. The demodulator and modulator may be formed as part of the processing block.

It will be recognized at this juncture that the circuit elements just described may form part of an RFID reader device. In this case, no power management unit is typically needed. Indeed, an RFID reader can typically be powered differently, such as from a wall outlet, a battery, and so on. Additionally, when configured to operate in conjunction with an RFID reader, the processing block may have additional Inputs/Output (I/O) ports to couple to a terminal, network, and other such devices or connections.

The IC 224 can include any one or more of the components described with respect to an RFID circuit. One or more of the sections described, and/or any of their components, may operate as the circuit 100 shown in FIG. 1. RFID circuits, as is well known in the art, may include additional components with respect to those that have been described, as well as different components, depending on the desired implementation. Readers of this document that desire to know more about the fundamentals of RFID circuit structure and function are therefore encouraged to consult U.S. Patent Publication No. 2005/0270189, assigned to the assignee of the disclosed embodiments, and incorporated herein by reference in its entirety.

Thus, additional embodiments may be realized. For example, referring now to FIGS. 1-2, it can be seen that an RFID tag 220 may comprise an antenna (e.g. comprising segments 227), a semiconductor substrate 174, and an electrical circuit 100 formed on the semiconductor substrate 174 and coupled to the antenna. The tag 220 may further comprise a gate layer 166 supported by the substrate 174, wherein the gate layer 166 does not overlap one of a source region 167 and a drain region 168 included in a semiconductor device 154 coupled to the electrical circuit 100. In this way, the RFID tag 220 that incorporates the circuit 100 can enjoy the benefits of snap-back voltage operation.

Figure 3:
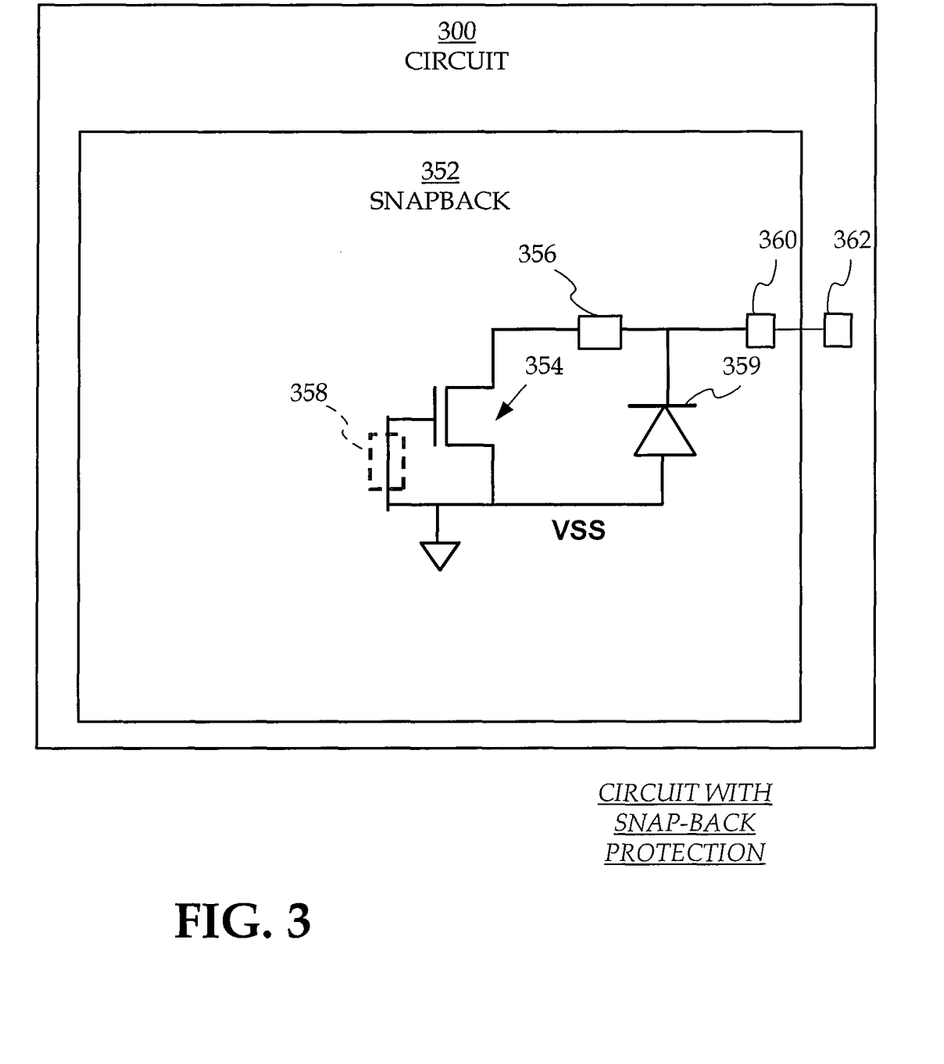
FIG. 3 is a block diagram of an integrated circuit device including a snap-back protection circuit according to various embodiments of the invention.

FIG. 3 is a block diagram of an integrated circuit device 352 including a snap-back protection circuit 354 according to various embodiments of the invention. In prior ESD protection approaches, two diodes and a resistor connected in a PI-configuration were used to coupled to the external pad 362. One of the two diodes, the primary ESD protection diode, was formed to be much larger than other (secondary ESD protection) diode.

In the various embodiments described herein, the primary ESD protection diode has been replaced with the snap-back transistor device 354, and the secondary device (in this case diode 359) can operate as a back-up if the primary device 354 fails. Thus, the MOS device 354 operates using a snap-back protection mechanism as the primary ESD protection device, and there is a junction diode 359 to provide additional protection as an optional secondary ESD protection device. The resistor 356 directs the ESD current return through the primary ESD device 354, since the ESD current return path sees a low impedance at the pad 360 coupled to the primary device 354, and a much greater impedance with respect to the protected circuit 300. Therefore, when a destructive ESD event occurs and injects ESD current into the node 362, the current is more likely to discharge through the primary device 354, as opposed to an internal node of the circuit 300. The soft $V_{DD}$ mechanism 358 is also shown here, and may be implemented as described previously.

The diode 359 may provide an additional function. For example, in some cases, it is possible that the snap-back device 354 may not trigger early enough to protect the circuit 300 when memory programming voltages are used. In this instance, the junction diode 359 can be added (e.g., as a combination of N+ material and P+ material) to provide earlier triggering of the snap-back device 354. However, it is also possible that the diode 359 may not be used for early triggering in many cases, since the drain of the NMOS snap-back device 354 already forms a diode.

When the circuit 300 operates at fairly high voltages (e.g., up to about +20 VDC), the junction diode 359 may be formed with a graded junction, as is known to those of ordinary skill in the art, since the graded junction has a higher breakdown voltage than an ungraded junction. The source and/or drain regions 167, 168 (see FIG. 1) in any of the devices described herein may also be formed as graded junctions.

Figure 4:
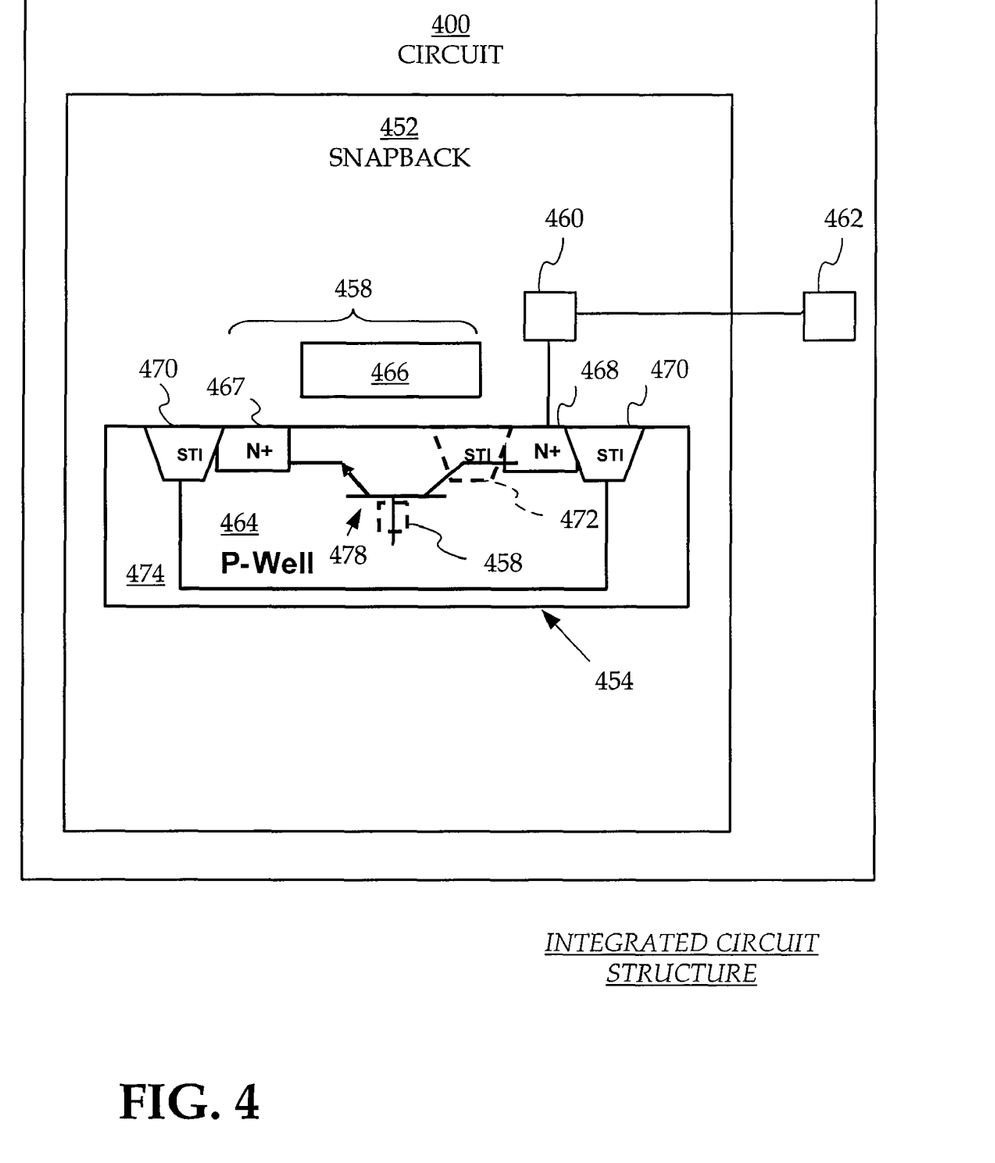
FIG. 4 is a structural diagram of an integrated circuit device including a snap-back protection circuit with a shortened gate structure according to various embodiments of the invention.

FIG. 4 is a structural diagram of an integrated circuit device 452 including a snap-back protection circuit 454 with a shortened gate structure according to various embodiments of the invention. Here it can be seen that the gate layer 466, which may be formed of polysilicon, is not formed in the usual manner of a self-aligned device. Rather, the gate layer 466 is formed so that either the source region 467 or the drain region 468 are not overlapped by the gate layer 466. In some embodiments, a mask is used to create the gap between the gate layer 466 and either the source region 467 or the drain region 468. In the embodiment shown, the p-well region 464, formed in the p-substrate 474, extends to include the implanted source and drain regions 467, 468.

The soft $V_{SS}$ structure can be implemented with a p-well resistor 458 coupling the gate layer 466 to the source region 467 in the p-well region 464, as shown. Shallow trench isolation (STI) using STI trenches, can also be implemented, if desired, as will be discussed below.

Figure 5:
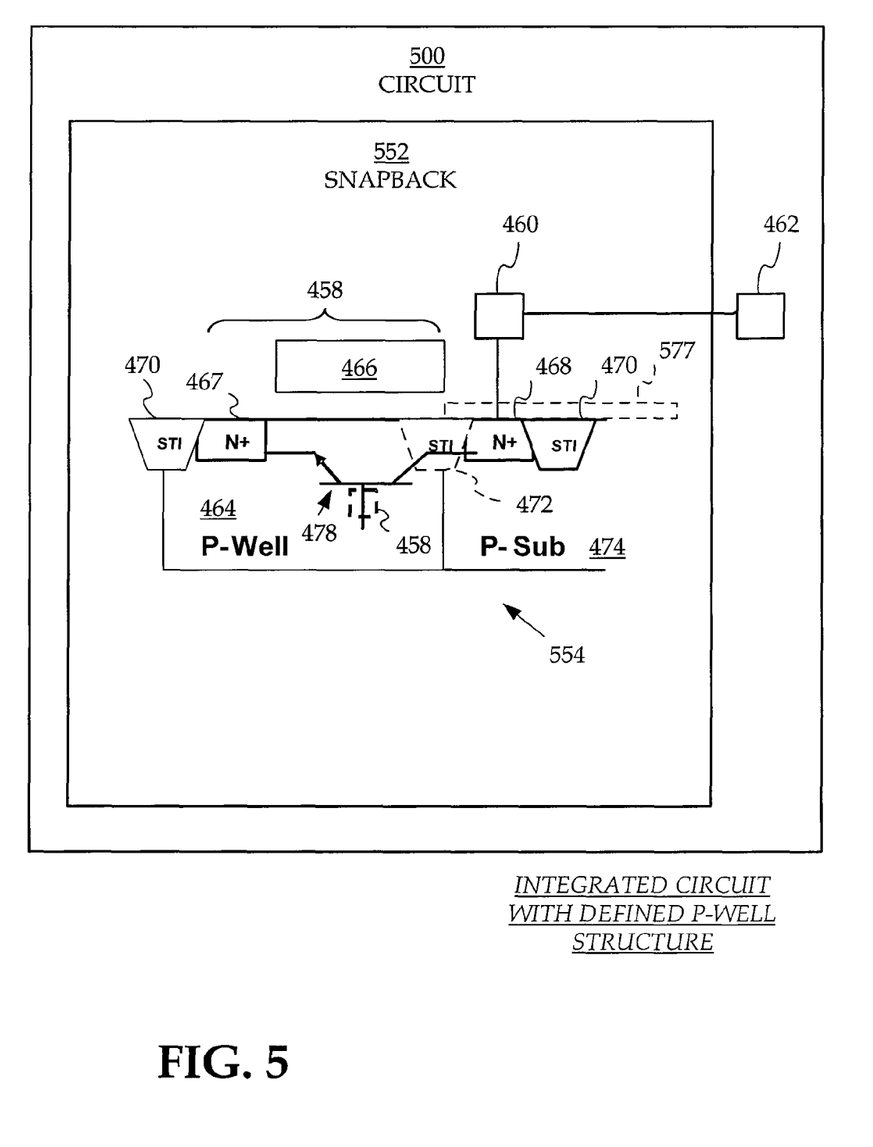
FIG. 5 is a structural diagram of an integrated circuit device including a snap-back protection circuit with a shortened gate and defined p-well structure according to various embodiments of the invention.

FIG. 5 is a structural diagram of an integrated circuit device 552 including a snap-back protection circuit 554 with a shortened gate and defined p-well structure according to various embodiments of the invention. Here, more complex embodiments can be implemented using a p-well blocking layer 577 during processing to define the boundaries of a p-well region 464 implanted in the substrate 474.

A special masking layer, or native NMOS layer, can be used to stop the p-well 464 implantation in a selected region of the substrate 474. In the embodiment of FIG. 4, for example, the p-well region 464 extends from the implanted source region 467 to the implanted drain region 468, with the pad 460 tied to the implanted drain region 468. However, in some embodiments, as shown in FIG. 5, the p-well implant blocking layer 577 can applied to the substrate 474 during processing to selectively block p-well implantation and define the p-well region 464. In this case, the shortened drain region 468 is outside the p-well region 464, and the source region 467 is inside the p-well region 464. Thus, the p-well blocking layer 577 can be overlaid during the manufacturing process onto the p-substrate 474 material to prevent forming the p-well region 464 in the substrate 474 in that area that is covered by the p-well blocking layer 577. This process results in forming the "half-native" device 554 shown in FIG. 5.

Shallow trench isolation (STI) regions 470 and 472 may also be employed in some embodiments. In this case, a trench is fabricated and filled with oxide. The STI region 472 can be used to provide an extra degree of isolation between the p-well region 464 and the drain region 468, and may permit placing the drain region 468 somewhat closer to the p-well region 464. The pad 460 is coupled to the p-substrate 574, via the drain region 468. The pad 460 is also coupled to the circuit 500 via node 462. This node 462 (and the circuitry coupled to it within the circuit 500) will then have some degree of protection from ESD events due to the presence of the snap-back device 554.

The polysilicon gate layer 466 is optional in some embodiments. This is because the N+ drain region 468 can be located in the p-substrate region 574, apart from the p-well region 464, and the device 554 may still operate using the snap-back mechanism.

Figure 6:
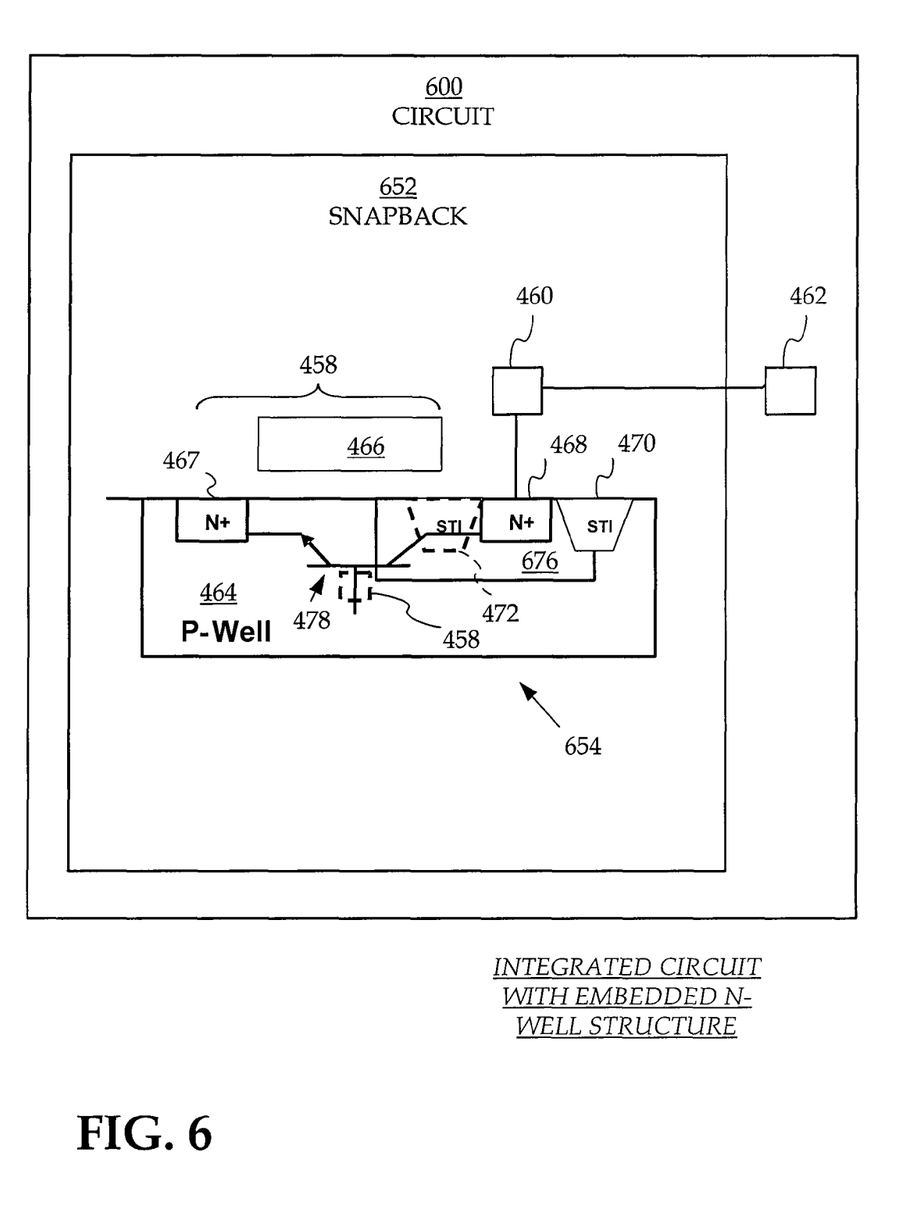
FIG. 6 is a structural diagram of an integrated circuit device including a snap-back protection circuit with a shortened gate and embedded n-well structure according to various embodiments of the invention.

FIG. 6 is a structural diagram of an integrated circuit device 652 including a snap-back protection circuit 654 with a shortened gate and embedded n-well structure according to various embodiments of the invention. In this n-well masked device 654, the n-well region 676 includes an N+ source region 468 and STI regions 470, 472.

In other embodiments (that have an N+ region in the p-substrate, e.g., FIG. 5), the breakdown voltage is relatively high compared to the breakdown voltage of an N+ region located in the p-well region. In the embodiment of FIG. 6, there is an N+ drain region 468 implanted in the n-well region 676, forming a first junction, and a second junction formed between the n-well region 676 and the p-well region 464. This n-FET implementation thus makes use of the N+ drain to n-well to p-well coupling to implement the snap-back mechanism, giving some degree of protection to the circuit 600. Here, the N+ drain region 468 doping is reduced by inserting the n-well region 676 in between the N+ drain region 468 and the p-well region 464.

Thus, referring now to FIGS. 1-6, it can be seen that many different embodiments may be realized. For example, an integrated circuit chip 124, 224 may comprise a semiconductor substrate 174, 474, an electrical circuit 100, 300, 400, 500, 600 formed on the semiconductor substrate 174, 474, and a gate layer 166, 466 supported by the substrate 174, 474 that does not overlap one of a source region 167, 467 and a drain region 168, 468 included in a semiconductor device 178, 478 coupled to the electrical circuit 100, 300, 400, 500. One of the source region 167, 467 and the drain region 168, 468 is then used to couple to the electrical circuit 100, 300, 400, 500, 600 to provide snap-back voltage operation and protection. The electrical circuit 100, 300, 400, 500, 600 may comprise a charge pump, a memory, an RFID circuit, and/or a processor, among others.

In some embodiments, the source and/or drain regions 167, 168, 467, 468 may form a graded junction with the semiconductor substrate 174, 474. A junction diode 359 having a first terminal coupled to the source region 167, 467 and a second terminal coupled to the drain region 168, 468, with or without a graded junction, may also be included in the integrated circuit chip 124, 224.

The integrated circuit chip 124, 224 may comprise one or more oxide trenches supported by the substrate 174, 474. The oxide trenches, perhaps in the form of STI regions 470, 472, may be used to isolate at least one of the source region 167, 467 and the drain region 168, 468 from a doped region (e.g., the p-well region 464) of the semiconductor substrate 174, 474.

In some embodiments, a p-well implant region 464 may be configured to receive both the source region 167, 467 and the drain region 168, 468. A p-well blocking layer 577 may be used during processing to form an integrated circuit chip 124, 224 that comprises a p-well implant region 464 configured to receive only one of the source region 167, 467 or the drain region 168, 468. An n-well implant region 676 may also be configured in the substrate 474 to receive one of the source region 167, 467 or the drain region 168, 468.

Other embodiments may be realized. For example, an RFID tag 220 may comprise an antenna (e.g., comprising segment(s) 227) coupled to an electrical circuit 100 formed on the semiconductor substrate 174 and coupled to the antenna. The tag 220 may also comprise a gate layer 166 supported by the substrate 174 that does not overlap one of a source region 167 and a drain region 168 included in a semiconductor device 178 coupled to the electrical circuit 100, such that the circuit 100 can receive some degree of ESD protection due to snap-back voltage operation of the device 178. Either one or both of the source and drain regions 167, 168 may form a graded junction with the semiconductor substrate 174. Oxide trenches (e.g., STI regions 470, 472), supported by the substrate 474, may be used to isolate the source and/or drain regions 467, 468 from a doped region (e.g., p-well region 464) of the semiconductor substrate 464.

Figure 7:
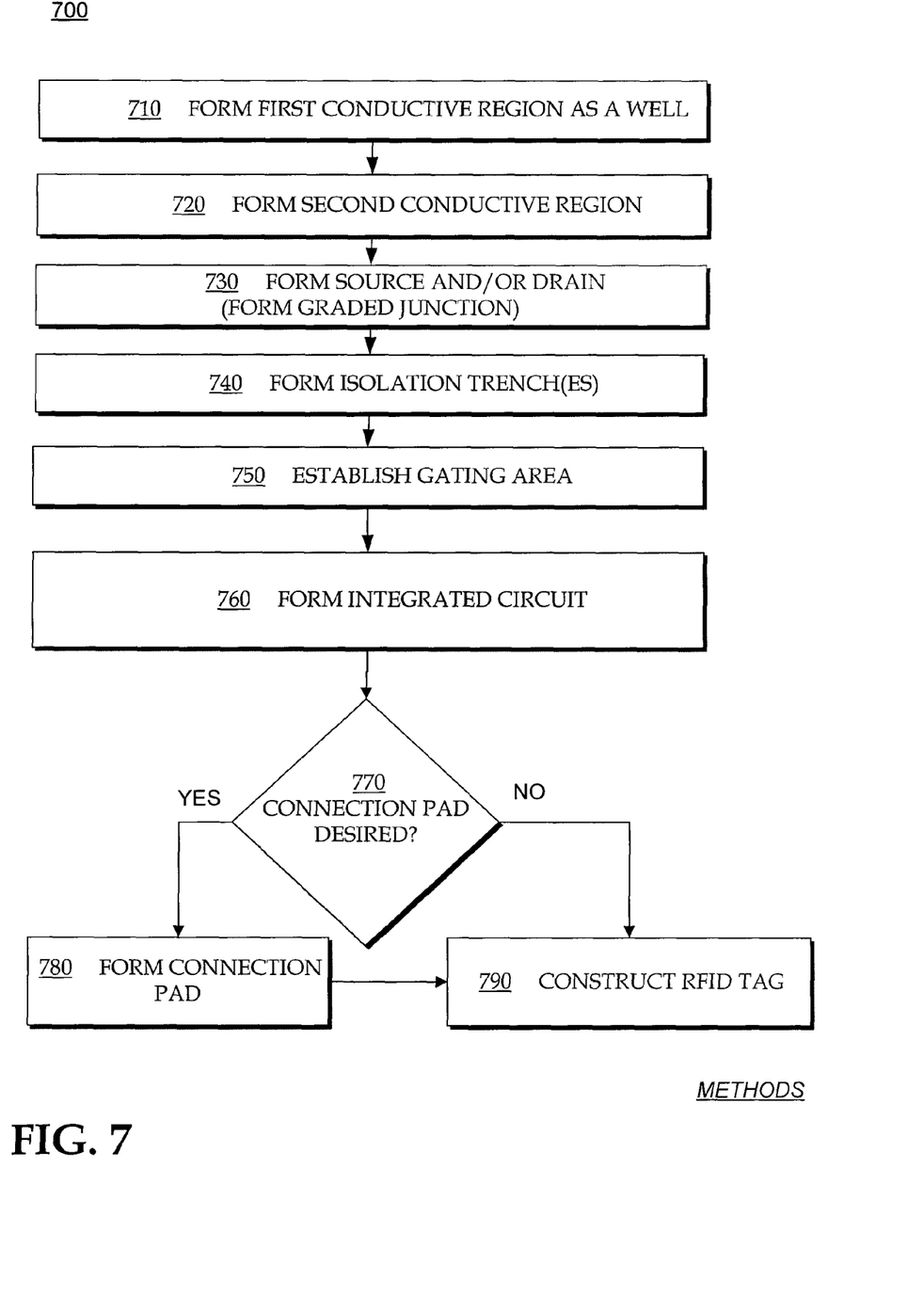
FIG. 7 is a flowchart illustrating methods of fabricating a snap-back protection circuit and other devices according to various embodiments of the invention.

Various embodiments of the invention include methods. An economy is achieved in the present document in that a single set of flowcharts is used to describe methods in and of themselves, along with operations of hardware and/or software. This is regardless of how each element is implemented. Several methods are now described more particularly according to various embodiments FIG. 7 is a flowchart illustrating methods 700 of fabricating a snap-back protection circuit and other devices according to various embodiments of the invention. Thus, it can be seen that in some embodiments a method 700 may include doping a semiconductor substrate to form a first conductive region as a well (e.g., a p-well) at block 710, and forming a second conductive region, such as an n-well region, in the well at block 720.

The method 700 may continue with forming one of a source region and a drain region in the well at block 730. In some cases, then, the activity at block 720 may include forming a second conductive region within the first conductive region, wherein the second conductive region is to receive only one of the source region or the drain region. In any case, forming the source region and/or drain region may comprise forming a graded junction between the substrate and the source region and/or drain region.

In some embodiments, the method 700 may include forming one or more isolation trenches proximate to at least one of the source region and the drain region at block 740. Thus, the activity at block 740 may include forming an isolation trench proximate to the second conductive region (e.g., n-well region).

The method 700 may continue at block 750 with depositing a layer of polysilicon on the substrate to establish a gating area that does not overlap the one of the source region and the drain region. The method 700 may include forming an integrated circuit supported by the substrate to couple to the source region or drain region to provide snap-back voltage operation at a node between the integrated circuit and the source or drain region at block 760.

If it is determined that a connection pad is desired at block 770, then the method 700 may include forming a connection pad coupled to the node at block 780. Whether or not a connection pad is desired, the method 700 may conclude at block 790, with constructing an RFID tag by attaching the substrate to an inlay (wherein the integrated circuit on the substrate comprises at least a portion of an RFID circuit), and coupling an antenna to the RFID circuit.

The electrical circuits described in this document can be manufactured in any number of ways, as will be appreciated by the persons skilled in the art. One such way is in the form of one or more integrated circuits.

Schematic-type inputs can be provided for the purpose of preparing one or more layouts. These inputs can include only the schematic of a circuit, or much more information, such as the relative sizes of circuit components, and the like, as may be appreciated by those of ordinary skill in the art of providing such inputs. These inputs can be provided in any suitable way, such as using a written document, or electronically, as computer files and the like. Some of these computer files can be prepared with the assistance of suitable design tools, which often include instrumentalities for simulating circuit behaviors and the like.

These inputs can be provided to a person of ordinary skill in the art of preparing layouts. This may occur whether the person is within the same company, or another company, such as under a contract. A layout can be prepared that embodies the schematic-type inputs by one of ordinary skill in the art. The layout itself may be prepared as a computer file, so that it can easily be checked for errors, modified as needed, and so on.

Layout computer files can be made to form portions of larger layout computer files. For example, suitable individual designs can be assembled for the electrical components and circuits indicated in the schematic-type inputs. The individual designs can be generated anew, or selected from existing libraries. In the layout phase, the assembled designs can be arranged to interoperate, so as to implement one or more integrated circuits comprising the electrical circuits of the provided schematic-type inputs. These computer files can be stored in storage media, such as memories, whether portable or not, and the like.

Then a special type of computer file can be synthesized from the prepared layout, in a manner that incorporates the prepared layout, which has the embodied schematic-type inputs. Such files are known in the industry as IC chip design files or tapeout files, and these embody instructions for machinery directing how to process a semiconductor wafer so as to produce an integrated circuit that is arranged as in the incorporated layout.

The synthesized tapeout file may be transferred to a semiconductor manufacturing plant, which is also known as a foundry, and so on. Transferring can occur using any suitable means, such as over an electronic network. Tapeout files can also be recorded in a storage medium, which in turn is physically shipped to the mask manufacturer.

The received tapeout file may be used by mask making machinery as instructions for processing a semiconductor wafer. The wafer, as thus processed, now has one or more integrated circuits, each made according to the layout incorporated in the tapeout file. If more than one integrated circuit is included in the wafer, then the wafer can be diced to separate them, and so on.

Thus, additional embodiments may be realized. For example, a method may comprise providing schematic-type inputs for the purpose of preparing a layout that embodies the schematic-type inputs, in which, if the layout is incorporated in a tapeout file that is used by mask making machinery as instructions for processing a semiconductor wafer, one or more integrated circuits will result on the wafer according to the schematic-type inputs.

The integrated circuits resulting on the wafer may each comprise any one or more of the component elements described with respect to the integrated circuit chips 124, 224 of FIGS. 1 and 2, as well as the circuits illustrated in FIGS. 3-6. In some embodiments, the method may comprise preparing the layout that embodies the provided schematic type inputs, synthesizing a tapeout file that incorporates the prepared layout to provide a synthesized tapeout file, and operating mask making machinery according to the synthesized tapeout file.

It should be noted that the methods described herein can be implemented in any number of ways, including via the structures described in this document. One such way is by machine operations, using devices of the type described in this document. Another optional way is for one or more of the individual operations of the methods to be performed in conjunction with one or more human operators performing others. These human operators need not be collocated with each other, but each may be located separately, along with one or more machines that perform a portion of the operations described.

In addition, it should be noted that the methods described herein do not have to be executed in the order described, or in any particular order. Moreover, various activities described with respect to the methods identified herein can be executed in iterative, repetitive, serial, or parallel fashion. Information, including parameters, commands, operands, and other data, can be sent and received in the form of one or more carrier waves.

Upon reading and comprehending the content of this disclosure, one of ordinary skill in the art will understand the manner in which a software program can be launched from a computer-readable medium in a computer-based system to execute the functions defined in the software program. One of ordinary skill in the art will further understand the various programming languages that may be employed to create one or more software programs designed to implement and perform the methods disclosed herein. The programs may be structured in an object-orientated format using an object-oriented language such as Java or C++. Alternatively, the programs can be structured in a procedure-orientated format using a procedural language, such as assembly or C. The software components may communicate using any of a number of mechanisms well known to those skilled in the art, such as application program interfaces or interprocess communication techniques, including remote procedure calls. The teachings of various embodiments are not limited to any particular programming language or environment.

Thus, other embodiments may be realized. For example, an article of manufacture, such as a computer, a memory system, a magnetic or optical disk, some other storage device, an RFID reader, an RFID tag, and/or any type of electronic device or system may include a processor coupled to a machine-accessible medium such as a memory (e.g., removable storage media, as well as any memory including an electrical, optical, or electromagnetic conductor) having associated information (e.g., computer program instructions and/or data), which when accessed, results in a machine (e.g., the processor) performing any of the actions described with respect to the methods above.

Thus, in some embodiments, an article may comprise a machine-readable memory containing thereon instructions which, if executed by mask making machinery as instructions for processing a semiconductor wafer, result in an integrated circuit on the wafer. The integrated circuits resulting on the wafer may each comprise any one or more of the component elements described with respect to the integrated circuit chips 124, 224 of FIGS. 1-2, as well as the circuits illustrated in FIGS. 3-6.

Implementing the circuits and methods disclosed herein may provide improved ESD protection for a variety of circuits, with more reliable operation of the protected circuitry as a result.

The accompanying drawings that form a part hereof, show by way of illustration, and not of limitation, specific embodiments in which the subject matter may be practiced. The architecture of the system is presented for purposes of explanation, and not of limitation. Its particular subdivision into modules need not be followed for creating embodiments according to the invention. Furthermore, the features of the invention can be performed either within a single one of the modules, or by a combination of them. An economy is achieved by using a single set of flowcharts to describe methods in and of themselves, along with operations of hardware and/or software. This is regardless of how each element is implemented.

The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

In this description, numerous specific details such as logic implementations, opcodes, means to specify operands, resource partitioning, sharing, and duplication implementations, types and interrelationships of system components, and logic partitioning/integration choices are set forth in order to provide a more thorough understanding of various embodiments. It will be appreciated, however, by those of ordinary skill in the art that embodiments of the invention may be practiced without such specific details. In other instances, control structures, gate level circuits, and full software instruction sequences have not been shown in detail so as not to obscure the embodiments of the invention.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37° C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A radio frequency identification (RFID) tag, comprising:
an antenna;
a semiconductor substrate;
an electrical circuit formed on the semiconductor substrate and coupled to the antenna; and
a gate layer supported by the substrate that does not overlap one of a source region and a drain region included in a semiconductor device coupled to the electrical circuit, wherein the one of the source region and the drain region is to couple to the electrical circuit to provide snap-back voltage operation.

2. The RFID tag of claim 1, wherein the one of the source region and the drain region forms a graded junction with the semiconductor substrate.

3. The RFID tag of claim 1, comprising:
an oxide trench to isolate at least one of the source region and the drain region from a doped region of the semiconductor substrate, wherein the oxide trench is supported by the substrate.

4. The RFID tag of claim 1, comprising:
a p-well implant region to receive only one of the source region or the drain region.

5. The RFID tag of claim 1, comprising:
a p-well implant region to receive the source region and the drain region.

6. The RFID tag of claim 1, comprising:
an n-well implant region to receive one of the source region and the drain region.

7. The RFID tag of claim 1, wherein the electrical circuit comprises a charge pump.

8. The RFID tag of claim 1, wherein the electrical circuit comprises a memory.

9. The RFID tag of claim 1, wherein the electrical circuit comprises a processor.

10. The RFID tag of claim 1, comprising:
a junction diode having a first terminal coupled to the source region and a second terminal coupled to the drain region.

* * * * *